(12) United States Patent
Holderer et al.

(10) Patent No.: US 6,392,824 B1
(45) Date of Patent: *May 21, 2002

(54) SOLDERING PROCESS FOR OPTICAL MATERIALS TO METAL MOUNTINGS, AND MOUNTED ASSEMBLIES

(75) Inventors: Hubert Holderer; Johannes Deyhle, both of Königsbronn; Ulrich Dietenmeier, Lauchheim, all of (DE)

(73) Assignee: Carl-Zeiss-Stiftung (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/134,227

(22) Filed: Aug. 14, 1998

(30) Foreign Application Priority Data

Aug. 18, 1997 (DE) .......... 197 35 760

(51) Int. Cl.⁷ .................. G02B 7/02
(52) U.S. Cl. .................. 359/819; 359/830
(58) Field of Search ............... 359/819, 811, 359/830; 228/122.1; 353/22, 23, 24; 362/445

(56) References Cited

U.S. PATENT DOCUMENTS

| | | | |
|---|---|---|---|
| 3,632,008 A | * 1/1972 | Lind | 220/2.3 A |
| 4,210,389 A | 7/1980 | Burkhart et al. | |
| 4,321,617 A | 3/1982 | Duda et al. | |
| 4,532,174 A | * 7/1985 | Freller et al. | 428/215 |
| 4,600,682 A | * 7/1986 | Spong et al. | |
| 4,615,951 A | 10/1986 | Bronnes et al. | |
| 4,649,085 A | 3/1987 | Landram | |
| 4,726,507 A | 2/1988 | Landram | |
| 4,743,302 A | * 5/1988 | Dumesnil et al. | 106/1.23 |
| 4,806,725 A | * 2/1989 | Narizuka et al. | 219/216 |
| 4,922,290 A | * 5/1990 | Yoshitake et al. | |
| 5,038,996 A | * 8/1991 | Wilcox et al. | 228/121 |
| 5,082,161 A | 1/1992 | Utida et al. | |
| 5,515,732 A | * 5/1996 | Willcox et al. | 73/724 |
| 5,518,964 A | * 5/1996 | DiStefano et al. | 437/209 |
| 5,753,972 A | * 5/1998 | Wein et al. | 257/691 |
| 5,771,562 A | * 6/1998 | Harvey, III et al. | 29/592.1 |
| 5,858,814 A | * 1/1999 | Goosen et al. | 438/107 |
| 5,901,901 A | * 5/1999 | Schneegans et al. | 228/254 |
| 5,937,320 A | * 8/1999 | Andricacos et al. | 438/614 |
| 5,953,623 A | * 9/1999 | Boyko et al. | 438/612 |

FOREIGN PATENT DOCUMENTS

| | | | |
|---|---|---|---|
| DE | 1 533 542 | 12/1970 | .......... B23K/35/26 |
| DE | 38 27 318 A1 | 3/1989 | .......... C04B/37/00 |

OTHER PUBLICATIONS

JP 58120578 A: Abstract of Japanese Patent Application. Jul. 18, 1993.
JP 1215745 A: Abstract of Japanese Patent Application. Aug. 29, 1989.
Nippes, Ernest. 1983. Metals Handbook Ninth Edition; vol. 6 Welding Brazing and Soldering. p. 1073–1074.*
Database WPI XP-002118852.
European Search Report Dated Oct. 25, 1999.

* cited by examiner

Primary Examiner—Tom Dunn
Assistant Examiner—Jonathan Johnson

(57) ABSTRACT

An assembly includes a part made of transparent material, in particular, quartz glass or calcium fluoride, and a metal part soldered. The following layer structure is present in the region of a solder joint: a transparent material of the transparent material part, an adhesion layer, a diffusion barrier layer, a first oxidation protection layer, a second oxidation protection layer, a solder layer, as required, a wetting auxiliary layer, and a metal of the metal part, respectively with transitions between the layers, in particular, in the typical manner for soldering, and possibly with diffusion of the two oxidation protection layers into the solder.

14 Claims, 1 Drawing Sheet

SOLDERING PROCESS FOR OPTICAL MATERIALS TO METAL MOUNTINGS, AND MOUNTED ASSEMBLIES

BACKGROUND OF THE INVENTION

1. Field of the Invention

The invention relates to a process for soldering optical elements to metal mountings and mounting assemblies, and more particularly, to a process for connecting a transparent optical element to metal mounting. The invention also relates to a mounting assembly of transparent optical element and a metal mounting.

2. Discussion of Relevant Prior Art

The brazing of quartz glass and the like to a nickel-iron alloy, with an intermediate ring of aluminum coated with zinc or zinc and gold or silver, is known from German Laid-Open Patent DE 38 27 318 A. The parts are brazed in a furnace at about 600° C. The patent focuses on the degree of sealing of the joint.

Japanese Laid-Open Patent JP 1/215745 A (Derwent WPI Abstract) describes oven soldering of quartz glass to metal, with a solder of indium, tin, silicon carbide and carbon at temperatures above 100° C. and under pressure. Coatings are not provided. Stresses are diminished by the solder layer. According to Japanese Patent Document JP 58/120578 A (Derwent WPI Abstract), quartz, borosilicate glass or other materials are coated with a film of noble metal, preferably by firing a paste. A metal part is coated with titanium or zirconium and then with silver solder or silver-copper solder. The two parts are brought together and are heated in a vacuum or under protective gas. The hard solder used makes high temperatures necessary. The parts are preferably of complex shapes, and are porous or foam-like. Optical elements are not mentioned.

SUMMARY OF THE INVENTION

The object of the invention is to provide a technique by which optical elements can be soldered to mountings. For this purpose, low process temperatures which lie below 200° C. and eventually even below 150° C. must be maintained to protect thin optical layers, as well as the lens material itself, for example, optical glass, quartz glass, calcium fluoride, or other fluorides. Likewise, thermal and other stresses, including compressive stresses during, before and after the soldering process, are to be kept to a minimum since they present a considerable danger to the permanence of the material and to optical functioning. Sufficient strength of the joint must be attained, with a tensile shear strength above about 10 N/mm$^2$.

This object is attained by a process for connection a part of transparent material with a metal part in a connecting region comprising: applying an adhesion layer and a solderable diffusion barrier to the transparent material part in the connecting region, applying a solder layer to the metal part, positioning the transparent material part and the metal part on each other, and bringing the transparent material part and the metal part in common to the melting temperature of the solder layer. The object is also attained through the use of an assembly, at comprising: a part made of transparent material, a metal part soldered thereto, a solder connection having a layer structure comprising: transparent material of the transparent material part, an adhesion layer, a diffusion barrier layer, a first oxidation protection layer, a second oxidation protection layer, a solder layer, and metal of the metal part, with transitions between the layers.

Soldering with a common temperature supply to all parts keeps thermal stresses minimal. This is supported by the use of low-melting solder.

The first coatings of both parts insure good strength; the respective antioxidation layers make possible simple manipulation, with the elimination of fluxes which represent a considerable risk in particular to the optical surfaces of lenses.

BRIEF DESCRIPTION OF THE DRAWINGS

The invention will be described in further detail with reference to the accompanying drawing, in which.

DETAILED DESCRIPTION OF PREFERRED EMBODIMENTS

Figure 1:
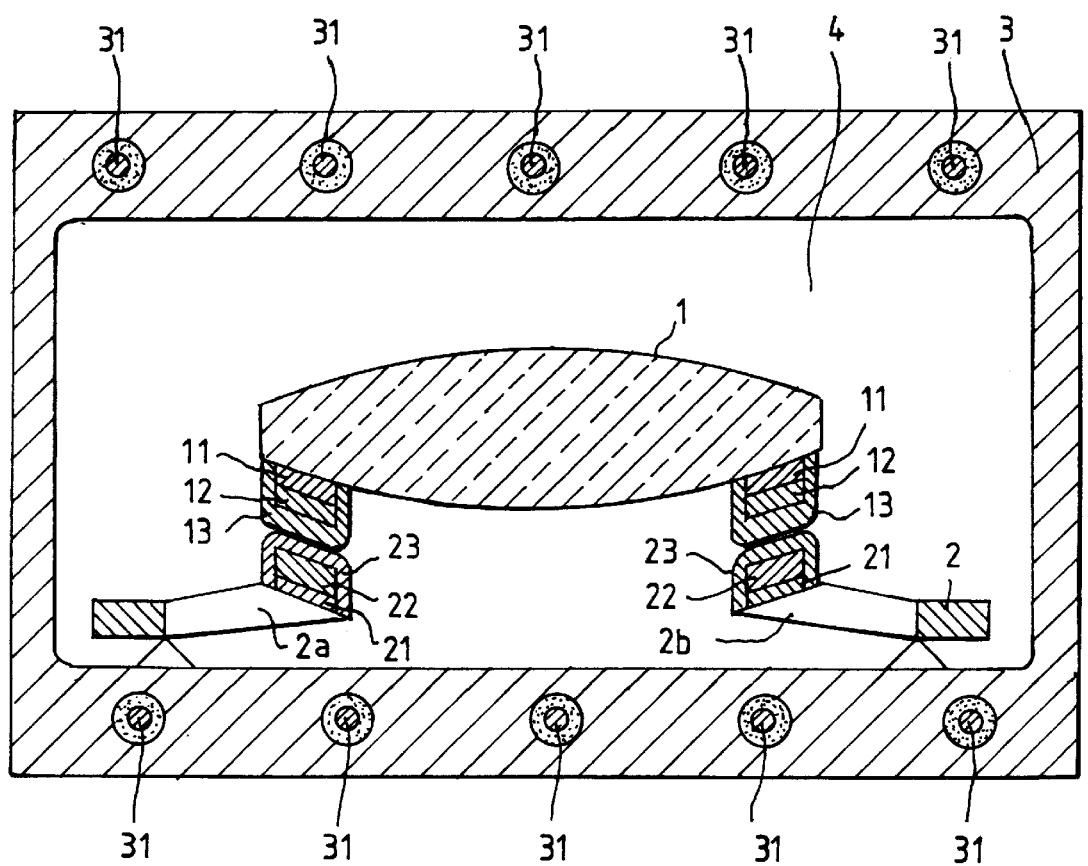
FIG. 1 shows a lens and mounting, with layers according to the invention, in an oven, and is wholly schematic.

The part 1 of transparent material is a lens in the example shown, especially a high precision UV lens of quartz glass or calcium fluoride, as a part of a projection exposure apparatus for microlithography. Such a system is extremely sensitive to disturbances such as shape changes or strain double refraction of individual lenses. In particular, because of its crystal structure, calcium fluoride material is susceptible to fractures due to temperature differences in the workpiece. High-grade antireflection layers on the lens (not shown here) likewise should not be thermally stressed, in order to prevent changes.

The mounting 2 is suited to these requirements. The lens 1 is provided in a thin-film apparatus with an adhesion layer 11, a solderable diffusion barrier layer 12, and a first oxidation protection layer 13. This coating takes place in vacuum coating equipment with a mask that reliably covers the optically used surfaces of the lens 1. Sputtering has been found to be a particularly suitable thin film technique, since layers that adhere well are produced at low temperatures.

The part 2, which acts as a mounting is provided beforehand with solder 22. In order to be able to connect a low-melting solder with a metal part 2 of stainless steel, a layer 21 that assists wetting is first applied to the metal part 2.

The solder layer 22 that follows is preferably coated with an oxidation protection layer 23. The coated part 2 can then be handled and heated without impairing the solder.

Since the solder layer has a thickness of about 100 $\mu$m, thin film techniques such as sputtering are not practicable for its production. All three layers 21–23 are therefore preferably applied electrochemically. The same coating technology for all three layers has the big advantage that the layers can be applied directly one after the other, without much handling expense, and without storage time in which oxidation would occur.

The coated lens 1 and the coated mounting 2 are positioned on each other, for which adjusting and holding devices are used as required, and are introduced into an oven 3. The interior 4 is flooded preferably with nitrogen or another inert gas. The oven 3 is heated by means of (electrical) heating bars 31 until the melting temperature of the solder 22 is reached. The solder 22 then forms alloys with the two oxidation protection layers 13, 23 and predominantly with the diffusion barrier layer 12, and wets the surface of the transparent part 1 (the lens) in the joint or connection region on a substantial area.

As an example, Table 1 gives preferred layer materials and layer thicknesses.

TABLE 1

| | | Material | Thickness ($\mu$m) |
|---|---|---|---|
| 1 | Lens | CaF$_2$ | |
| 11 | Adhesion layer | Cr | 0.5 |
| 12 | Diffusion barrier layer | Ni | 5 |
| 13 | #1 oxidation protection layer | Au | 0.1 |
| 23 | #2 oxidation protection layer | Au | 0.1 |
| 22 | Solder | SnPb | 100 |
| 21 | Wetting auxiliary layer | Ni | 5 |
| 2 | Mounting | Stainless steel | |

The melting temperature is 183° C. in this case. The heating takes place in 15 min, and the cooling to room temperature in 30 min. The tensile shear strength of the joint attains 15 MPa.

The same layers are suitable for quartz glass as the transparent part, and likewise for pure aluminum and for titanium as the materials of the mounting. Brass or copper as materials of the mounting require no wetting auxiliary layer 21.

Quartz glass instead of calcium fluoride withstands even greater thermal stresses, so that the heating can also take place in this case without an oven: for example, inductively, by a heating plate, by an infrared radiator, and so on.

Other alloys with low melting temperatures are also candidates as solders; for example, 52% iridium and 48% tin with a melting temperature of 118° C., and 80% iridium, 15% lead and 5% silver with a melting temperature of 149° C.

All known passivating layers are candidates as the oxidation protection layers 13, 23 for the solder or for the diffusion barrier layer.

The layer thicknesses can of course be varied. In particular, the thickness of the solder layer 22 can be adjusted to the tolerance of the connection surfaces of the transparent part 1 and of the metal part 2.

We claim:

1. An assembly for connecting a lens made of CaF$_2$ to a metal mount by soldering, comprising:
   a lens made of CaF$_2$ having a connection region only on the periphery of said lens,
   a metal mount part soldered to said peripheral connection region, comprising:
      a solder connection having a layer structure comprising CaF$_2$ lens material, comprising:
         an adhesive layer selected from the group consisting of chromium and aluminum,
         a diffusion barrier layer made of nickel following said adhesive layer,
         a first oxidation protective layer following said diffusion barrier layer,
         a second oxidation protective layer following said first oxidation protective layer,
         a solder layer of approximately 100 $\mu$m thickness following said second oxidation protective layer, selected from the group consisting of a tin alloy and an indium alloy, having a melting temperature below 200° C.,
         a wetting auxiliary layer following said solder layer comprising nickel,
         said metal mount part comprising steel,
         with transitions between said layers.

2. The assembly according to claim 1, in which said metal part (2) comprises a mounting.

3. The assembly according to claim 1, in which said second oxidation protection layer (23) comprises gold.

4. The assembly according to claim 1, in which said first oxidation protection layer (13) comprises gold.

5. The assembly according to claim 1, in which said transitions include a soldering transition.

6. The assembly according to claim 5, in which said soldering transition includes diffusion of said first and second oxidation protection layers (13, 23) into said solder layer (22).

7. An assembly for connecting a lens made of CaF$_2$ to a metal mount by soldering, comprising:
   a lens having a connection region only on the periphery of said lens,
   a metal mount part soldered to said peripheral connection region, comprising:
      a solder connection having a layer structure, comprising:
         an adhesive layer selected from the group consisting of chromium and aluminum,
         a diffusion barrier layer made of nickel following said adhesive layer,
         a first oxidation protective layer following said diffusion barrier layer,
         a second oxidation protective layer following said first oxidation protective layer,
         a solder layer of approximately 100 $\mu$m thickness following said second oxidation protective layer, selected from the group consisting of a tin alloy and an indium alloy, having a melting temperature below 200° C.,
         a wetting auxiliary layer following said solder layer comprising nickel,
         said metal mount part comprising steel,
         with transitions between said layers.

8. The assembly according to claim 7, in which said metal part (2) comprises a mounting.

9. The assembly according to claim 7, in which said second oxidation protection layer (23) comprises gold.

10. The assembly according to claim 7, in which said transitions include a soldering transition.

11. An assembly, for connecting a lens made of CaF$_2$ to a metal mount by soldering, comprising:
   a lens having a connection region only on the periphery of said lens,
   a metal mount part soldered to said peripheral connection region, comprising:
      a solder connection having a layer structure, comprising:
         an adhesive layer selected from the group consisting of chromium and aluminum,
         a diffusion barrier layer made of nickel following said adhesive layer,
         a first oxidation protective layer following said diffusion barrier layer,
         a second oxidation protective layer following said first oxidation protective layer,
         a solder layer of approximately 100 $\mu$m thickness following said second oxidation protective layer, selected from the group consisting of a tin alloy and an indium alloy, having a melting temperature below 200° C.

12. The assembly according to claim 11, comprising a wetting auxiliary layer following said solder layer, said metal mount part comprising at least one metal.

13. The assembly according to claim 12, in which said transitions include a soldering transition.

14. The assembly according to claim 13, in which said transitions include a soldering transition.

* * * * *